United States Patent [19]

Solomon

[11] Patent Number: 4,992,908

[45] Date of Patent: Feb. 12, 1991

[54] INTEGRATED CIRCUIT MODULE

[75] Inventor: Allen L. Solomon, Fullerton, Calif.

[73] Assignee: Grumman Aerospace Corporation, Bethpage, N.Y.

[21] Appl. No.: 383,429

[22] Filed: Jul. 24, 1989

[51] Int. Cl.$^5$ .............................................. H05K 7/02
[52] U.S. Cl. .................................. 361/400; 361/403; 361/405; 361/406; 439/65
[58] Field of Search ................................. 361/392–397, 361/399, 400, 403, 404–406, 409, 412–415; 439/64, 65, 326, 327

[56] References Cited

U.S. PATENT DOCUMENTS

| | | | |
|---|---|---|---|
| 3,949,274 | 4/1976 | Anacker | 361/393 |
| 4,304,624 | 12/1981 | Carson et al. | 156/630 |
| 4,502,098 | 2/1985 | Brown et al. | 361/412 |
| 4,703,170 | 10/1987 | Schmitz | 250/211 |

Primary Examiner—Gregory D. Thompson
Attorney, Agent, or Firm—Stetina and Brunda

[57] ABSTRACT

An integrated circuit module and technique for forming the same are disclosed. The module includes a plurality of integrated circuit layers having beveled vertical edges along a portion thereof. The layers are connected to a contact board disposed orthogonal to the layers and also having a beveled first surface formed to receive and support the integrated circuit layers.

12 Claims, 4 Drawing Sheets

INTEGRATED CIRCUIT MODULE

BACKGROUND OF THE INVENTION

The present invention relates to integrated circuit modules and, more particularly to integrated circuit modules suitable for supporting arrays of infrared detector elements in a space environment.

Infrared detector modules are used for a variety of purposes including space surveillance. In view of the stringent environmental and performance demands of such systems, as well as space limitations relating to launch and orbit, substantial needs have developed to miniaturize the modules while retaining high performance and high reliability of operation.

For example, in order to provide accurate resolution of infrared imaging it may be necessary to space infrared detector elements by 4 mils or less. It is also desirable to provide some form of focal plane processing in order to limit the need to communicate raw data to remote processors. Consequently, there has developed a need to provide an improved module structure which not only satisfies the dense connectivity problems but also permits on-focal plane processing of the raw input signals.

A variety of contructions have been proposed for integrated circuit modules. One such structure is disclosed in U.S. Pat. No. 4,703,170 issued to Charles E. Schmitz and assigned to the common assignee. One area of difficulty with respect to such modules concerns the physical means for connecting the infrared detector array, bonded to a buffer or contact board or interface device to the module supporting the processing circuitry. Common techniques for such effecting such physical and electrical connections include the formation of indium bumps on the surface of the detector interface device which abut against conductive regions formed on vertical edge surfaces of the module layers. The indium bumps of the interface device and the edge surfaces of the module are typically held in place by an insulating adhesive material. In such a structure the individual layers are not supported by the structure of the detector interface device or by the shape or structure of the module layers. Such a construction has several drawbacks. It not only requires tedious alignment of the detector interface device and the module, but it also requires that the entire detector interface device/module interface be encased in adhesive as a means to connect the module to the detector interface device. Thus, individual module layers cannot be selectively removed from the module. The fabrication of such a module typically proceeds by forming a rigid multilayer module first before connecting the module to the detector interface device.

As a practical matter, there is the difficulty of spacing the layers to match the spacing of the detector elements, which is the same as that of the interface device or contact board, and to make readily electrical contact between the stacked layers and the contact board. Further, the extreme thinness of the module layers and the dense processing requirements result in a predictable number of defects which frequently cannot be identified until the module layers are connected to the detector interface device. However, because the module layers are permanently connected, defects with respect to any particular layer typically result in discarding the entire module.

Accordingly, there exists a need for developing an alternate arrangement for connecting module layers with the detector interface device that renders the physical and electrical connections more reliable, less tedious, and facilitates selective replacement of individual layers even after the module is formed and connected to the detector interface device.

SUMMARY OF THE INVENTION

An integrated circuit module and technique for forming the same are disclosed. The module includes a plurality of integrated circuit layers having beveled vertical edges along a portion thereof. The layers are connected to a contact board disposed orthogonal to the layers and also having a beveled first surface formed to receive and support the integrated circuit layers.

The integrated circuit layers may have beveled portions at opposite ends thereof to faciliate connection to a pair of contact boards each disposed on one end of the integrated circuit layer. Communication of electrical signals is facilitated by conductive pads formed on the beveled surfaces of the integrated circuit layer and contact board.

In the presently preferred embodiment the edges of the integrated circuit layers are beveled only along a portion thereof, the remaining portion being normal to the first surface of the layer. The contact board similarly incorporates unbeveled portions extending between beveled portions. The unbeveled portions facilitate reliable structural and electrical connection between the integrated circuit layers and the contact boards despite dimensional variations in the integrated circuit layers and contact boards.

In the presently preferred embodiment the beveled portions are formed by anisotropic etching of the surfaces of single crystalline silicon integrated circuit layers and contact boards. The integrated circuit layers and circuit boards are formed to have crystalline lattice structure oriented so that, upon anisotropic etching, the beveled portions are inclined to compliment each other, thereby facilitating precise mating of the circuit layer surface and the contact board surface.

Adhesive layers, or adhesive lands may be disposed between adjacent integrated circuit layers. Adhesive lands may also be disposed to connect the integrated circuit layers to the contact boards, e.g. intermediate the beveled surfaces. Where the integrated circuit layers are secured to the contact board at both ends, the integrated circuit layers need not be secured together by adhesive material. Thus, individual circuit layers may be removed from the module, i.e., removed from connection to the contact boards, without the need to disassemble the entire module. Alternatively, the layers may be secured to each other and/or to the contact board by material, e.g., solder, that can be readily liquefied to faciliate selective removal of individual circuit layers without disassembling the entire module.

DETAILED DESCRIPTION OF THE PRESENTLY PREFERRED EMBODIMENT

The detailed description set forth below in connection with the appended drawings is intended as a description of the presently preferred embodiment of the invention, and is not intended to represent the only form in which the present invention may be constructed or utilized. The description sets forth the functions and sequence of steps for construction of the invention in connection with the illustrated embodiment. It is to be understood, however, that the same or equivalent functions and sequences may be accomplished by different embodiments that are also intended to be encompassed within the scope of the invention.

Figure 1:
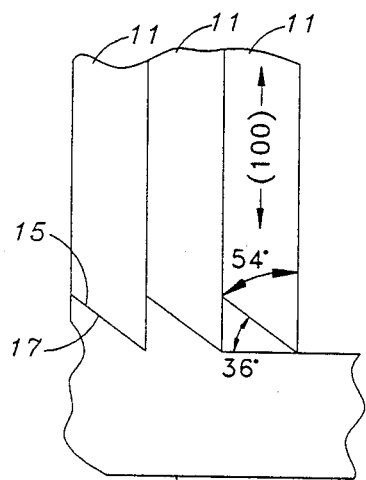
FIG. 1 is a partial side view of an integrated circuit module showing complementary contact angles where beveled layers engage the contact board.

FIG. 1 is a partial sectional view illustrating the connection of layers 11 having beveled edges that form thereon, with contact board 13 having a sawtooth pattern formed in one surface thereof. As shown at FIG. 1 the layers 11 are each formed to have a beveled edge 15, where the said edge is formed by anisotropically etching (100) single crystalline silicon. The contact board 13 is formed to have a beveled edge 17 shaped to mate with layer beveled edge 15, at a complementary angle to edge 15.

As previously mentioned the layers are preferably formed to be extremely thin, i.e., approximately 3 to 4 mils. The formation of electrical contacts between stacked layers and contact board involves a tediously performed number process to obtain the required periodic spacing of layers in the stack by controlling the thickness of each layer, to prepare the contacts on the face of the stack and to align and to bump bond electrical contacts to the contact boards. The present invention employs a beveled edge layer stack face and a beveled groove contact board. This involves far less tedious processing.

There is to be addressed, however, the problem of forming precision matching angles by the use of anisotropic etching of the edge portions of both the layers and the contact board surface. It is to be understood, however, that the present invention is not to be viewed as limited to a particular method of forming precision matching angles on the mating surface. It is anticipated that other methods, which may be more or less efficient, may be used within the broader aspects of the present invention.

The anisotropic etching technique utilized in the presently preferred embodiment effectively etches the single crystalline material in a predictable direction in relation to the crystalline lattice. In the presently preferred embodiment the integrated circuit layers 11 are formed on (100) oriented single crystalline silicon material. The anisotropic etching selectively etches away atoms of a silicon until it reaches the portion of the silicon crystal lattice defined by the (111) plane. In effect, anisotropic etching results in a beveled edge, the angle of which is determined by the silicon crystal lattice. In the presently preferred embodiment, the silicon wafer is formed such that the (100) orientation of the silicon molecule is arrayed in the direction shown at FIG. 1. As a result, anisotropic etching of the silicon layers 11 results in the formation of the beveled surface or portion 15 shown at FIG. 1. In view of the particular crystalline lattice structure of the silicon molecule the beveled surface 15 is formed to have a bevel which is inclined as shown at FIG. 1. That bevel angle is repeatable so long as the (100) crystal orientation of the silicon module remains as indicated. Because the bevel angle is not a 45° angle but 54°, when (100) single crystalline silicon material is used, the angle of the contact board beveled grooves must be formed to accommodate the bevel of the layers. As described below this is done by forming the contact board to have a crystal lattice orientation where anisotropic etching forms a bevel that compliments the bevel of the layers, namely, a 36° angle.

Figure 2A:
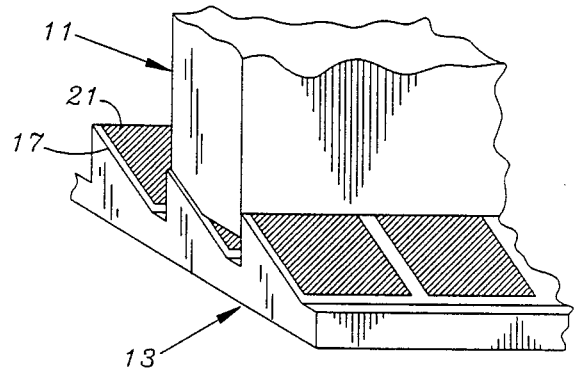
FIG. 2a is a perspective view of a single integrated circuit layer connected to a grooved contact board.
Figure 2B:
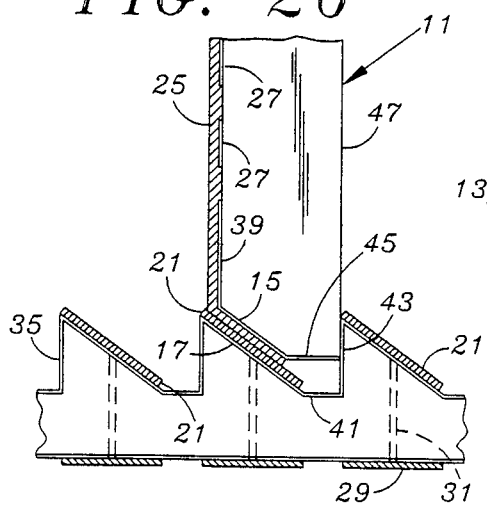
FIG. 2b is a side view of the construction shown at FIG. 2a, further illustrating conductive pads, conductive vias and integrated circuit structure.

FIGS. 2a and 2b illustrate the formation of the mating surfaces of the layers and the contact board in accordance with the presently preferred embodiment of the invention. As shown at FIG. 2a the contact board 13 is formed to include a plurality of conductive pads 21 formed on the beveled surfaces 17. As shown at FIG. 2b the layers 11 are formed to include conductive pads 23 which are in abutting electrical connection with contact board pads 21. The layer conductive pads 23 are in electrical communication with conductive pattern 25 formed on a first surface of layer 11. The conductive pattern 25 communicates signals from the conductive pad 23 to integrated circuit structure 27 formed in the surface of layer 11.

Though the figures illustrate the connection of the layers 11 to a single contact board, it is to be understood that the layers 11 may be connected to a second contact board along the opposite edge of the contact boards. The second contact board may be structured and formed in the identical manner as contact board 13. As a result of the two contact board embodiment the layers 11 are supported at both ends by the contact boards.

Figure 4:
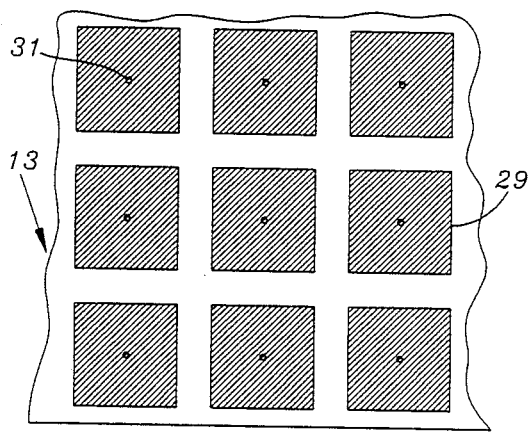
FIG. 4 is a bottom view of the contact board illustrating a plurality of conductive pads.
Figure 5:
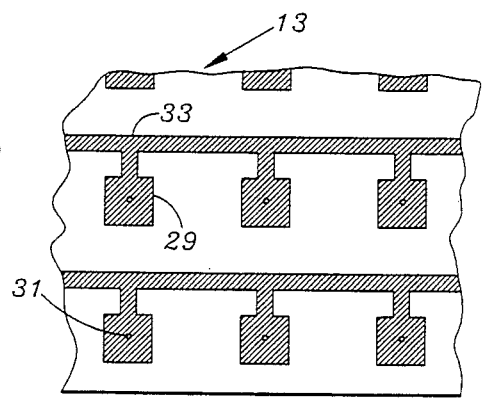
FIG. 5 is a bottom view of an alternate contact board construction wherein rows of the conductive pads are interconnected.

Referring again to FIG. 2b, further illustration is provided with respect to preferred structure of the contact board 13. As shown therein the contact board 13 is also provided with a plurality of conductive pads 29 formed on the second surface of the contact board. The conductive pads 29 preferably form an area array on the lower surface of the contact board 13, as shown more clearly at FIG. 4. FIG. 5 illustrates the underside of contact board 13 wherein the conductive pads 29 are reduced in size and are arrayed in rows interconnected by conductive strips 33. Depending upon the processing application it may be useful to interconnect some rows, alternate rows or all rows of the conductive pads, so that the information received from the interconnected detector elements (not shown) may be processed in the most efficient and useful manner.

Referring again to FIG. 2b, the electrical communication between pads 21 and conductive pads 29 is preferably effected by a conductive via 31 extending through the contact board 13. In the presently preferred embodiment the conductive via is formed by well known techniques such as vapor deposition of a through hole formed in the contact board 13.

Figure 3A:
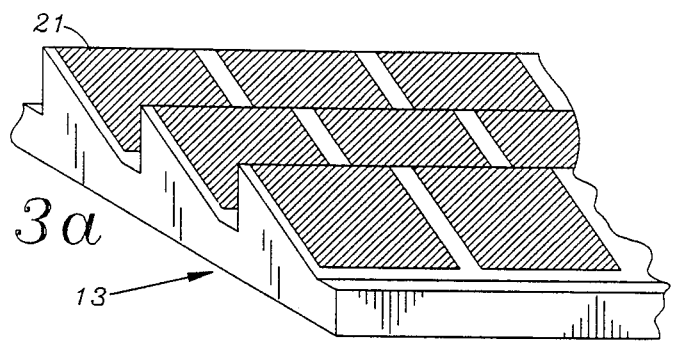
FIG. 3a is a perspective view of the grooved contact board showing the conductive pads formed on the inclined surfaces.
Figure 3B:
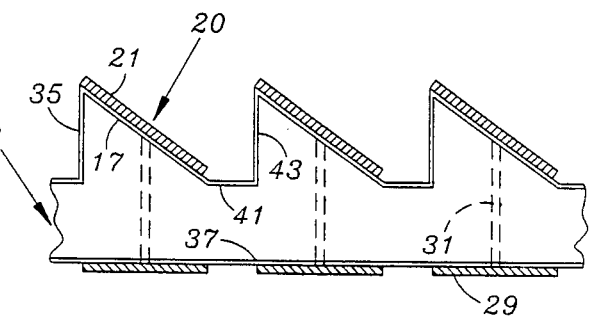
FIG. 3b is a side view of the contact board shown at FIG. 3a, further illustrating additional contact pads and conductive vias extending through the contact board.

FIGS. 3a and 3b provide additional illustration of the contact board 13 shown at FIGS. 2a and 2b. FIG. 3b also illustrates the formation of insulating oxide layer 35 formed on the surface of contact board 13. The opposite side of layer 13 may also be provided with an oxide layer 37, as shown at FIGS. 2b and 3b. The layer 11 may also be provided with an insulating oxide layer 39, as shown at FIG. 2b.

As shown at FIG. 3b the upper surface of contact board 13 is formed to include a plurality of grooves or channels 20, each characterized by an incline surface 17, a horizontal portion 41 and a vertical portion 43. The incline surface 17 and vertical surface 43 serve to receive and engage the corresponding surfaces of the layers 11, as can be seen from FIGS. 2a and 2b. The horizontal portion 41 provides a basis of accommodating dimensional variations without degrading the structural or electrical integrity of the connection between the layer 11 and contact board 13. The layer 11 is similarly formed to have a beveled portion 15, an unbeveled portion 45 and a bottom portion 47. Portions 41 and 45 need not be sized to be the same and indeed may vary in lengths or thicknesses without impeding the integrity of the connection between the layer 11 and board 13.

Figure 6B:
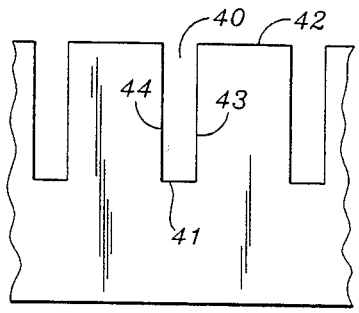
FIGS. 6a, 6b, 7 and 8 illustrate the fabrication of the contact board.
Figure 6A:
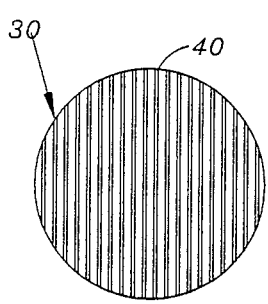
Figure 7:
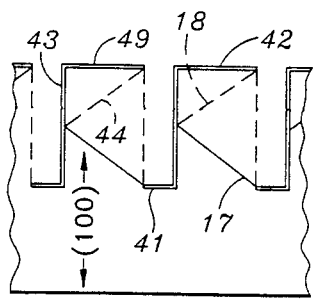
Figure 8:
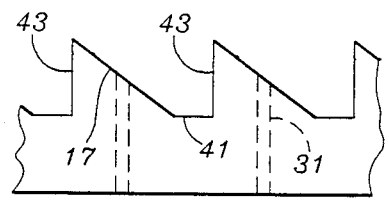

FIGS. 6a, 6b, 7 and 8 illustrate steps in the formation of the contact board 13. As shown in FIG. 6a, the formation of the contact board 13 commences with the formation of a silicon wafer 30 which is grooved as shown at FIGS. 6a and 6b. The grooves 40 extend into the upper surface 42 of the wafer 30 and are defined by sidewalls 43, 44 and bottom 41. As shown at FIG. 7 the wafer is formed such that the silicon crystalline lattice has a (100) orientation in the vertical direction as illustrated, or in the (110) orientation in the horizontal direction. A layer of photoresist 49 is formed along the surfaces 42 of the wafer, vertical wall 43, excluding vertical wall 44 of grooves 40 as shown at FIG. 7. An anisotropic etchant is then applied to the wafer. This results in an essentially V-shaped etch from wall 44, which is defined by surfaces 17 and 18. The etching is allowed to continue until the V-shaped etch reaches and bisects wall 43, allowing the severing of the portion of the wafer above surface 17. The resulting structure is illustrated at FIG. 8. As also shown at FIG. 8, conductive vias 31 are then formed in the wafer. The silicon surfaces, which include the via hole walls are oxide coated. Metal film is deposited on these surfaces. Conductive pads 21 and 29 are then formed as shown at FIG. 3b.

Figure 9:
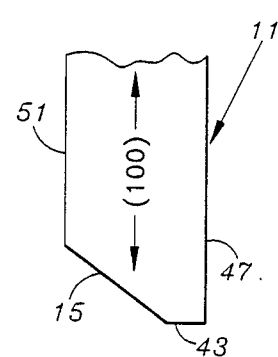
FIGS. 9, 10, 11, 12, 13a and 13b illustrate the formation of the integrated circuit layers.
Figure 10:
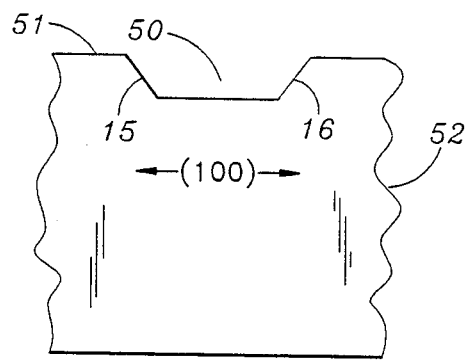
Figure 11:
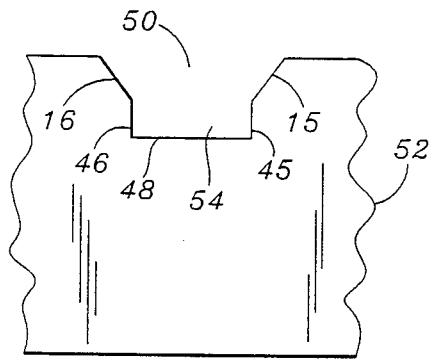

FIGS. 9, 10, 11, 12, 13a and 13b illustrate the formation of the integrated circuit layers 11. FIG. 9 generally illustrates an edge of the layer 11 including beveled surface 15, unbeveled surface 43, lower surface 47 and upper surface 51. As shown at FIG. 9 the layer is formed of single crystalline silicon material having a crystalline lattice orientation wherein the (100) orientation of the lattice is formed as indicated. FIG. 10 illustrates the initial steps in forming the layer 11. As shown therein a groove 50 is formed in the silicon wafer 52. In the presently preferred embodiment the groove 50 is formed by anisotropic etching of the upper surface 51. However, it is to be understood that other alternate methods may be used to form groove 50 without departing from the broader aspects of the invention. As also shown in FIG. 10 the groove 50 is defined by inclined sidewalls 15 and 16. The anisotropic etching is allowed to proceed to the point illustrated at FIG. 10, after which groove 50 is extended by the formation of a trench 54. The trench 54 is defined by sidewalls 45, 46 and bottom surface 48.

Figure 12:
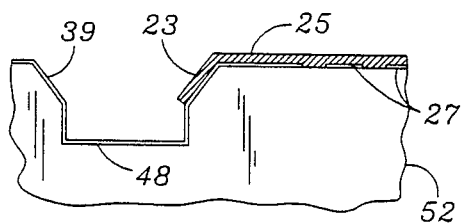

As shown at FIG. 12 the upper surface of wafer 52 is then provided with an oxide layer 39. Integrated circuit structure 27 is formed in the upper surface of the wafer 52. Conductive pads 23 and conductive pattern 25 are formed to provide electrical communication between the integrated circuit structure 27 and pads 23. It is to be understood that the grooves 50 are repeated along the surface of the wafer 52 and that the opposing beveled surface 16 (see e.g. FIG. 11) may similarly be provided with a conductive pad in electrical communication with the integrated circuit structure 27. In such a manner the layer may be formed to be disposed intermediate a pair of contact boards 13.

Figure 13A:
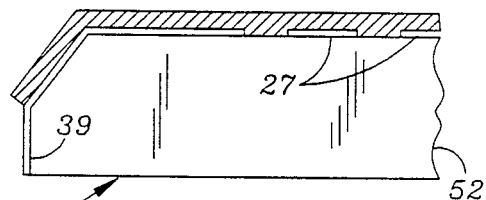
Figure 13B:
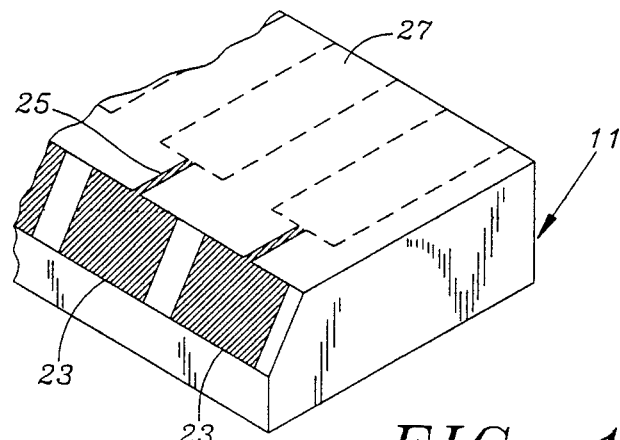

As shown at FIG. 13a the wafer 52 is then thinned to approximately a thickness conforming to trench lower surface 48, resulting in the severing of multiple structures conforming to layers 11. FIG. 13b provides further illustration of the layer 11 showing redundant conductive pads 23, each connected to an integrated structure 27 (shown within dashed lines) by conductive pattern 25.

Figure 14:
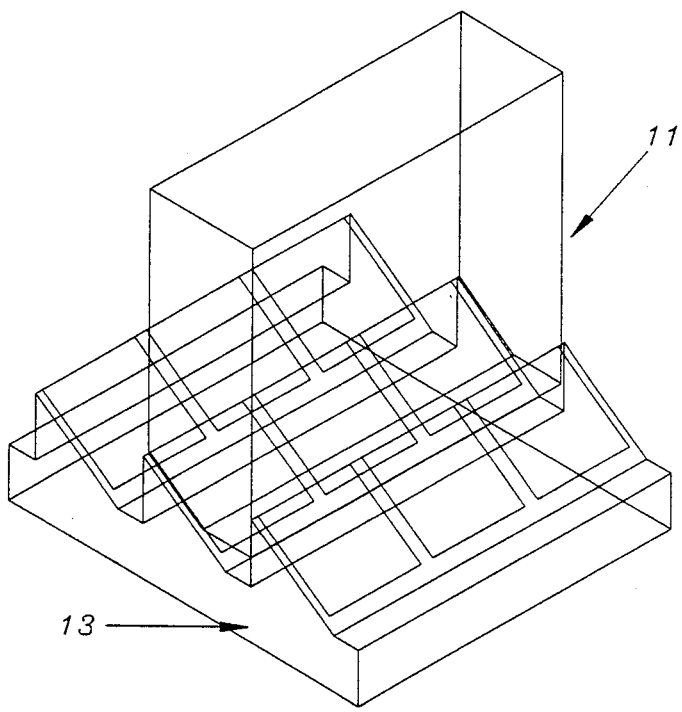
FIGS. 14 and 15 are perspective views illustrating the assembly of the contact board and integrated circuit layers to form the integrated circuit module.
Figure 15:
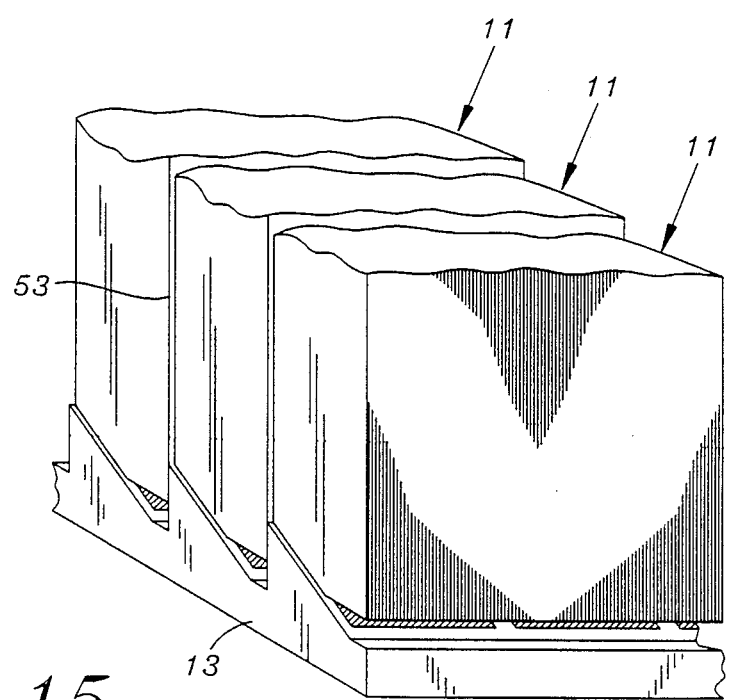

The contact pads on the layer and the board, which are to be bonded, can be coated with a low melting alloy, such as a solder or with a metal pillar bump, such as indium. This process can be performed optionally as a part of wafer fabrication. The layers 11 can then be disposed to engage a portion of contact board 13 as shown at FIG. 14. Alloy bonding can then be performed by heating. FIG. 15 illustrates a plurality of circuit layers 11 connected to a single contact board 13.

The layers 11 may be bonded and separated by layers of insulating adhesive material, disposed in channels 53 separating adjacent layers 11. Alternatively, small lands of insulating adhesive may be disposed within channels 53 to provide adhesion and separation between adjacent layers while facilitating removal of the adhesive land and selective removal of individual layers 11 while the other layers 11 remain in contact with the contact board 13. Where two contact boards 13 are utilized, the layers 11 can be sufficiently supported between the two contact boards 13 to avoid the need for adhesive layers to provide structural integrity to the module. In such a case the removal of an individual layer 11 may be effected without the need to disturb adjacent layers 11. Indeed, in such a construction the need for adhesive layers or adhesive lands between adjacent layers 11 may be completely eliminated. Thus, the module may be formed without adhesion of the layers 11 into a unitary structure prior to connection of the layers to the contact board 13.

Various other modifications and enhancements may be made within the scope of the present invention. As previously indicated the precise angle of the beveled surfaces may be varied in accordance with a particular material and the characteristic crystalline structure of that material. Additionally, mechanical or optical methods may be used to form the beveled surfaces described above. Such mechanical or optical techniques may be particularly appropriate where the size of the contact board and layers permit the efficient use of such techniques.

What is claimed is:

1. An integrated circuit module comprising:

a plurality of integrated circuit layers, each of said layers having upper and lower surfaces and first and second vertical edges, at least a first of said vertical edges being beveled along at least a portion thereof;

a first contact board disposed orthogonal to the integrated circuit layers and connected to the respective first vertical edge thereof, said first contact board having a first and second surface, said first surface having a plurality of layer receiving channels each formed to receive and support a plurality of the integrated circuit layers, each of said channels having a beveled portion, formed to abut against and support the respective circuit layer first edge beveled portion, and a vertical portion formed to abut against and support the respective circuit layer lower surface;

each of said integrated circuit layers having an integrated circuit structure formed on the upper surface thereof;

each of said integrated circuit layers also having first conductive pads formed on the first edge beveled portion, said first conductive pads being in electrical connection with the integrated circuit structure formed on the respective layer;

said first contact board further having second conductive pads formed on each of the beveled portions thereof for abutting electrical connection with the first conductive pads formed on the integrated circuit layer;

said first contact board further having a plurality of third conductive pads formed on the second surface thereof, each of said third conductive pads being connected to a dedicated second conductive pad by a conductive via extending through the first contact board.

2. The module as recited in claim 1 wherein each of said circuit layers second vertical edges is beveled along a portion thereof, each said second vertical edge beveled, portion having fourth conductive pads formed thereon, each fourth conductive pad being in electrical communication with the integrated circuit structure formed on the respective integrated circuit layer.

3. The module as recited in claim 2 further comprising a second contact board disposed orthogonal to the integrated circuit layers and connected to the second vertical edges thereof, said second contact board having first and second surfaces, said first surface having a plurality of layer receiving channels, each of said channels having a beveled portion formed to abut against and support the respective circuit layer second edge beveled portion and a vertical portion formed to abut against and support the respective circuit layer lower surface.

4. The module as recited in claim 3 wherein said second contact board further comprises fifth conductive pads formed on each of the beveled portions thereof for abutting electrical connection with fourth conductive pads formed on the integrated circuit layer.

5. The module as recited in claim 4 wherein said second contact board further comprises a plurality of sixth conductive pads formed on the second surface thereof, each of said sixth conductive pads being connected to a dedicated fifth conductive pad by a conductive via extending through the second contact board.

6. The module as recited in claim 1 wherein said third conductive pads are connectable to a planar array of infrared detection modules.

7. The module as recited in claim 1 wherein said integrated circuit layers are formed to be between 3 to 4 mils thick.

8. The module as recited in claim 3 wherein individual integrated circuit layers are separately removable from the integrated circuit module.

9. The module as recited in claim 1 wherein each layer beveled portion extends along only a portion of the respective layer first vertical edge, the remaining portion of each first vertical edge being useful to facilitate abutting engagement of the respective integrated circuit layer with the contact board despite dimensional variations in the construction of the respective integrated circuit layer and first contact board.

10. The module as recited in claim 9 wherein the first surface of the first contact board further comprises a horizontal surface portion extending between the contact board beveled portion and the contact board vertical 11. The module as recited in claim 1 wherein the integrated circuit layers are formed to have a layer crystalline lattice structure that is characterized by a (100) crystal orientation extending parallel to the respective layer upper surface.

12. The module as recited in claim 1 wherein the first contact board is formed to have a crystalline lattice structure that is characterized by a (100) crystal orientation extending perpendicular to the circuit board second surface.

* * * * *